United States Patent
Lille et al.

(10) Patent No.: US 11,271,036 B2
(45) Date of Patent: Mar. 8, 2022

(54) MEMORY DEVICE CONTAINING DUAL ETCH STOP LAYERS FOR SELECTOR ELEMENTS AND METHOD OF MAKING THE SAME

(71) Applicant: SANDISK TECHNOLOGIES LLC, Addison, TX (US)

(72) Inventors: Jeffrey Lille, Sunnyvale, CA (US); Kanaiyalal Patel, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 71 days.

(21) Appl. No.: 16/910,799

(22) Filed: Jun. 24, 2020

(65) Prior Publication Data
US 2021/0408114 A1 Dec. 30, 2021

(51) Int. Cl.
*H01L 27/22* (2006.01)
*H01L 43/02* (2006.01)
*H01L 43/12* (2006.01)

(52) U.S. Cl.
CPC ........... *H01L 27/224* (2013.01); *H01L 43/02* (2013.01); *H01L 43/12* (2013.01)

(58) Field of Classification Search
CPC ....... H01L 27/224; H01L 43/02; H01L 43/12; G11C 11/16
USPC .......................................................... 257/4
See application file for complete search history.

(56) References Cited

U.S. PATENT DOCUMENTS

| | | |
|---|---|---|
| 7,955,870 B2 | 6/2011 | Ditizio |
| 10,381,551 B1 | 8/2019 | Lille |
| 2002/0009858 A1 | 1/2002 | Doan et al. |
| 2002/0016054 A1 | 2/2002 | Doan et al. |
| 2002/0175322 A1 | 11/2002 | Doan et al. |
| 2003/0127669 A1 | 7/2003 | Doan et al. |
| 2004/0036065 A1 | 2/2004 | Doan et al. |

(Continued)

FOREIGN PATENT DOCUMENTS

WO WO-2020136464 A1 * 7/2020 ........... H01L 27/108

OTHER PUBLICATIONS

Notification of Transmittal of the International Search Report and the Written Opinion of the International Searching Authority for International Patent Application No. PCTUS2020/067742, dated May 4, 2021, 11 pages.

(Continued)

*Primary Examiner* — Jami Valentine Miller
(74) *Attorney, Agent, or Firm* — The Marbury Law Group PLLC

(57) ABSTRACT

A refractory metal-containing etch stop layer, a ruthenium etch stop layer, and a conductive material layer can be sequentially formed over an electrode layer and a selector material layer. A sequence of anisotropic etch processes can be employed to etch the conductive material layer selective to the ruthenium etch stop layer, to etch the ruthenium etch stop layer selective to the refractory metal-containing etch stop layer, and to etch the refractory metal-containing etch stop layer within minimal overetch into the electrode layer. The selector material layer can be subsequently anisotropically etched without exposure to the plasma of etchant gases for etching the refractory metal-containing etch stop layer and the conductive material layer, which may include a fluorine-containing plasma that can damage the selector material.

20 Claims, 10 Drawing Sheets

(56) References Cited

U.S. PATENT DOCUMENTS

| | | | |
|---|---|---|---|
| 2005/0001246 A1* | 1/2005 | Mouli | H01L 27/14689 257/291 |
| 2006/0211888 A1 | 9/2006 | Oohara et al. | |
| 2007/0096090 A1 | 5/2007 | Dennison | |
| 2007/0105267 A1 | 5/2007 | Karpov et al. | |
| 2008/0006810 A1 | 1/2008 | Park et al. | |
| 2010/0163822 A1 | 7/2010 | Ovshinsky et al. | |
| 2012/0025164 A1 | 2/2012 | Deweerd et al. | |
| 2012/0220099 A1 | 8/2012 | Dennison | |
| 2013/0126822 A1 | 5/2013 | Pellizzer et al. | |
| 2013/0341587 A1 | 12/2013 | Pellizzer et al. | |
| 2013/0344676 A1 | 12/2013 | Chang et al. | |
| 2014/0104939 A1 | 4/2014 | Karpov et al. | |
| 2014/0169062 A1 | 6/2014 | Lee et al. | |
| 2015/0144864 A1 | 5/2015 | Pellizzer et al. | |
| 2015/0262663 A1 | 9/2015 | Lee et al. | |
| 2017/0117328 A1 | 4/2017 | Terai | |
| 2017/0288139 A1* | 10/2017 | Narayanan | H01L 45/1253 |
| 2018/0040669 A1 | 2/2018 | Wu et al. | |
| 2018/0287055 A1 | 10/2018 | Park | |
| 2019/0115393 A1 | 4/2019 | Cheng et al. | |
| 2020/0006431 A1 | 1/2020 | Mayuzumi et al. | |
| 2020/0006633 A1 | 1/2020 | Lille | |
| 2021/0305318 A1* | 9/2021 | Gealy | H01L 45/141 |

OTHER PUBLICATIONS

Lee, B.T. et al., "Characteristics of Ru as a Buffer Layer or an Etch Stopper for EUVL Mask Patterning," Microelectronic Engineering, 61-62, pp. 233-239, (2002).

Lee, B.T. et al., "Characteristics of Ru as a buffer layer or an etch stopper for EUVL mask patterning," Microelectronic Engineering, vols. 61-62, pp. 233-239, (2002)—ABSTRACT https://doi org/10.1016/S0167-9317(02)00534-8.

U.S. Appl. No. 16/212,132, filed Dec. 6, 2018, SanDisk Technologies LLC.

U.S. Appl. No. 16/212,257, filed Dec. 6, 2018, SanDisk Technologies LLC.

U.S. Appl. No. 16/212,420, filed Dec. 6, 2018, SanDisk Technologies LLC.

U.S. Appl. No. 16/442,858, filed Jun. 17, 2019, SanDisk Technologies LLC.

U.S. Appl. No. 16/558,552, filed Sep. 3, 2019, SanDisk Technologies LLC.

* cited by examiner

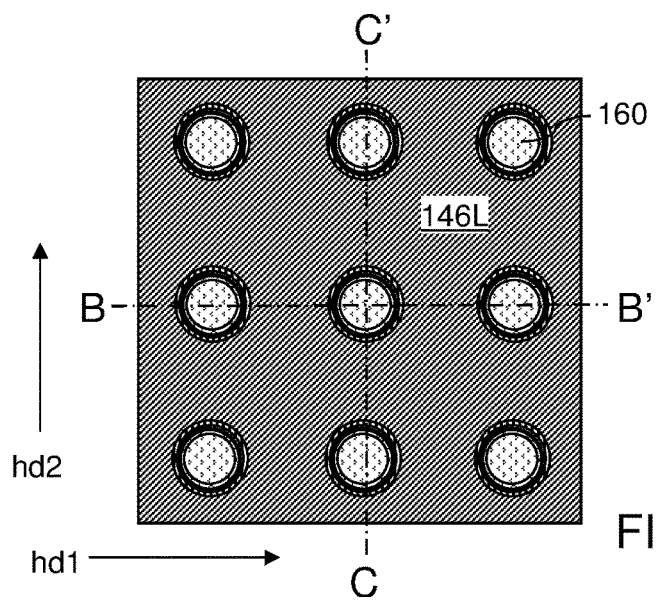
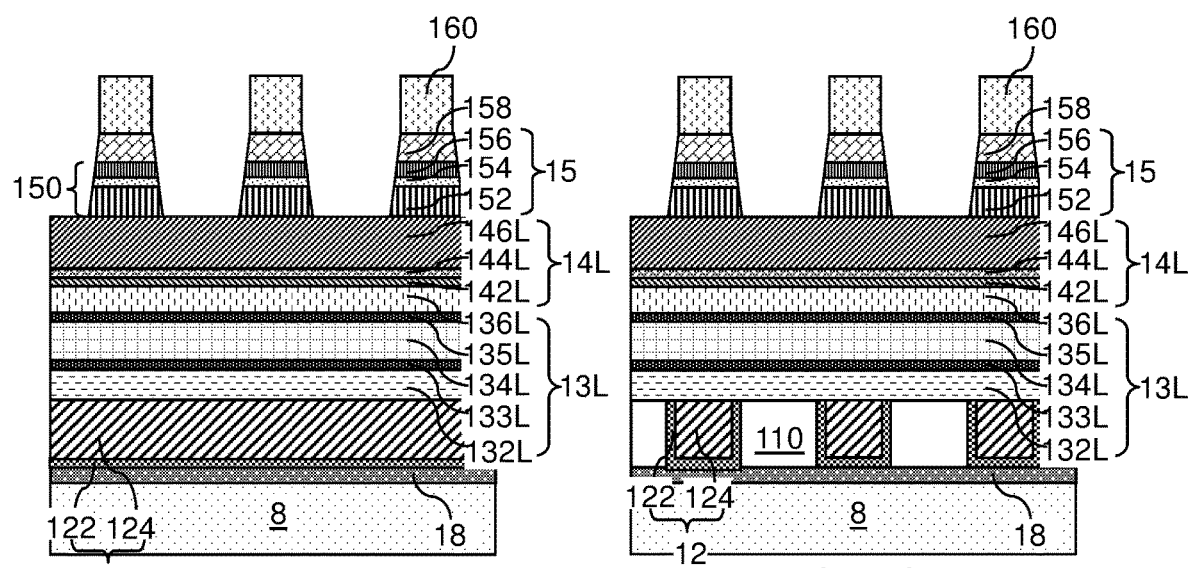
FIG. 4A
FIG. 4B
FIG. 4C

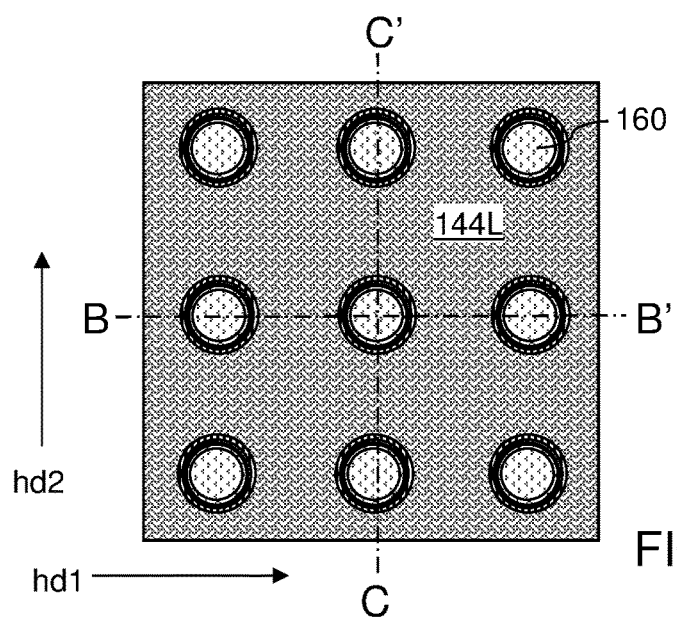
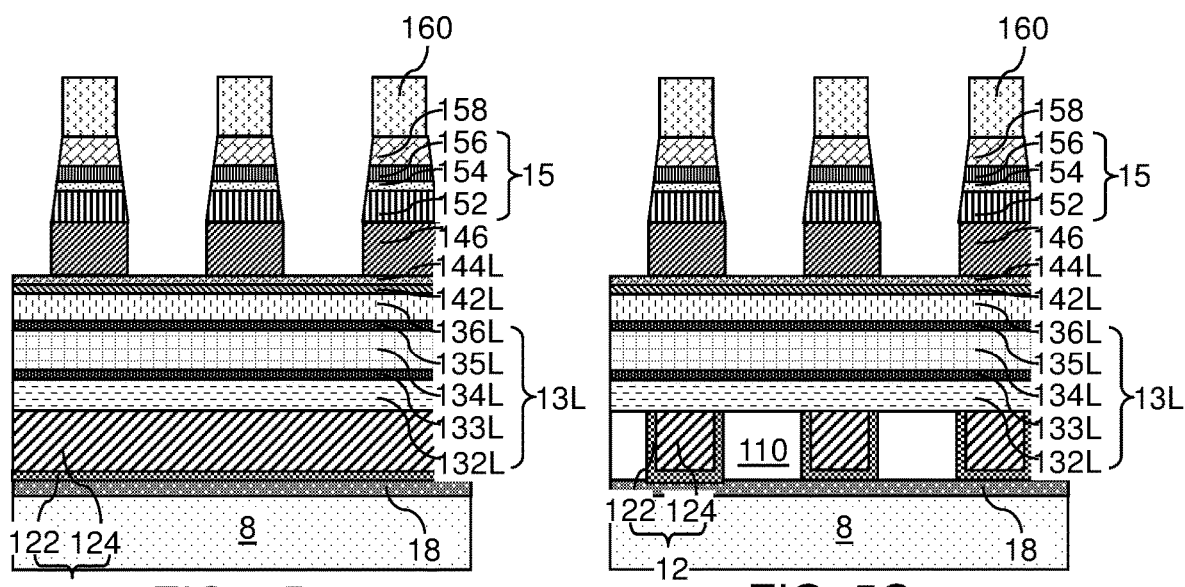
FIG. 5A
FIG. 5B
FIG. 5C

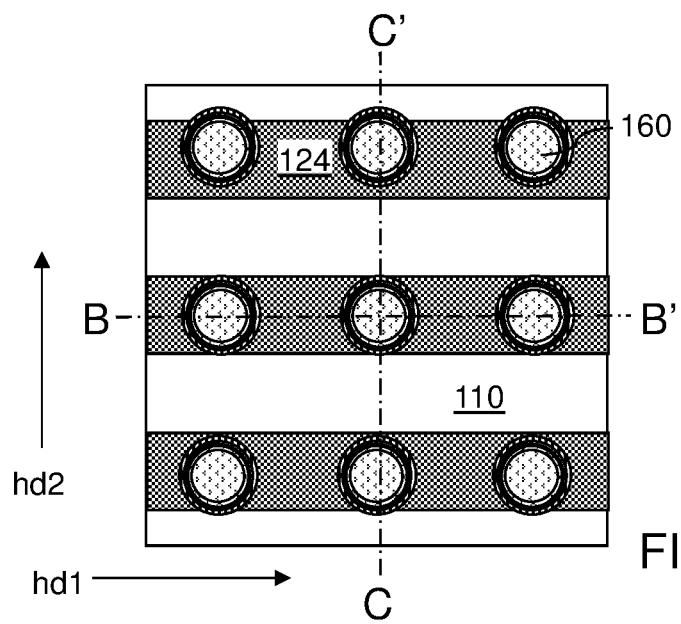
FIG. 8A
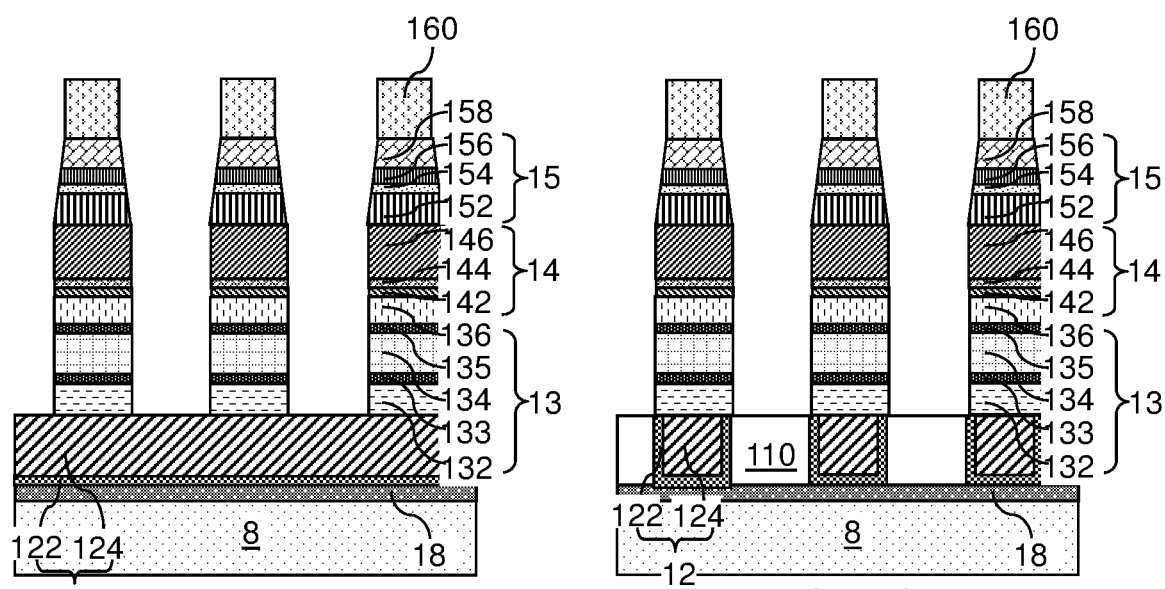
FIG. 8B
FIG. 8C

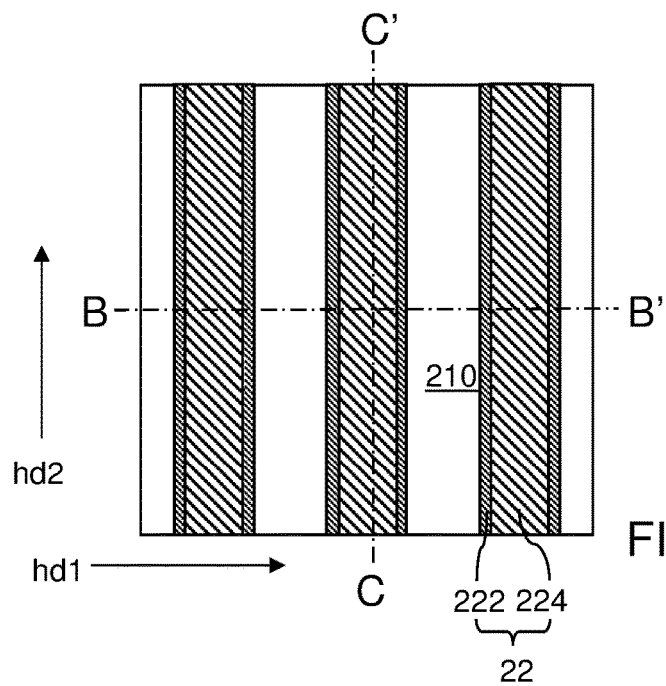
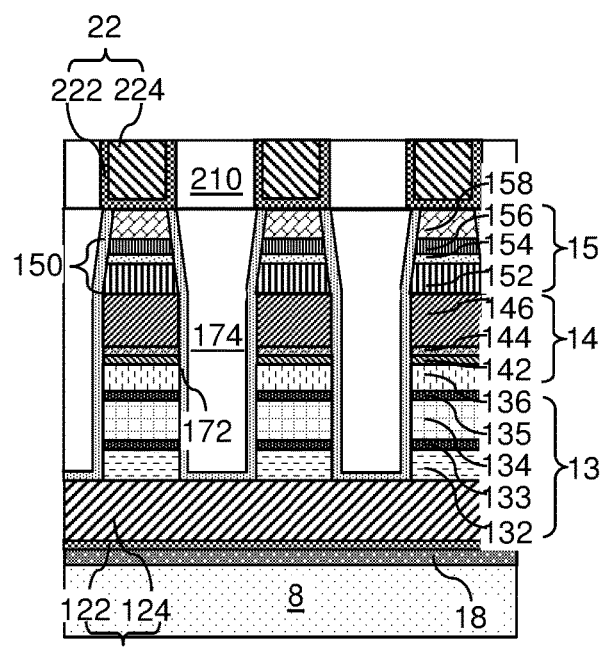 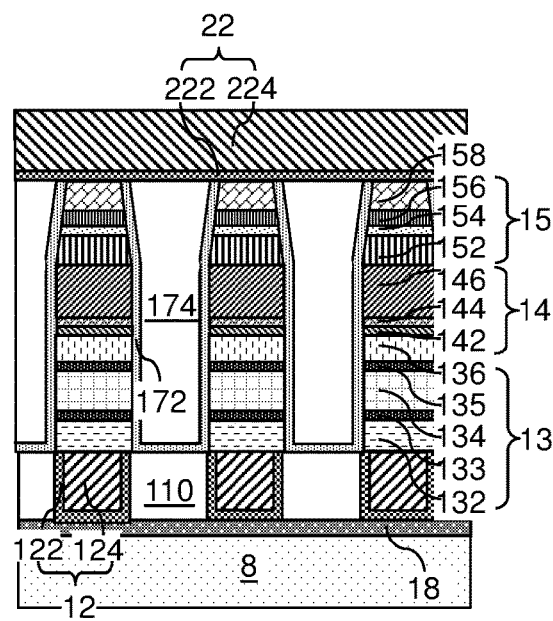

US 11,271,036 B2

MEMORY DEVICE CONTAINING DUAL ETCH STOP LAYERS FOR SELECTOR ELEMENTS AND METHOD OF MAKING THE SAME

FIELD

The present disclosure relates generally to the field of memory devices and specifically to a method of patterning selector elements of magnetoresistive random access memory (MRAM) memory devices using dual etch stop layers, and devices formed by the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a method of forming a memory device comprises forming a layer stack including a lower electrode layer, a selector material layer, an upper electrode layer, a refractory metal-containing etch stop layer, a ruthenium etch stop layer, a conductive material layer, and at least one memory material layer over a substrate; patterning the at least one memory material layer into a memory element; patterning the conductive material layer into a conductive pillar using the ruthenium etch stop layer as an etch stop by performing a first anisotropic etch process having a first etch chemistry that etches the conductive material layer selective to ruthenium; patterning the ruthenium etch stop layer into an ruthenium plate using the refractory metal-containing etch stop layer as an etch stop by performing a second anisotropic etch process having a second etch chemistry that etches ruthenium selective to a material of the refractory metal-containing etch stop layer; patterning the refractory metal-containing etch stop layer into refractory metal-containing etch stop plate by performing a third anisotropic etch process having a third etch chemistry that etches a material of the refractory metal-containing etch stop layer selective to a material of the upper electrode layer without etching through the upper electrode layer; and anisotropically etching the upper electrode layer, the selector material layer, and the lower electrode layer by performing additional anisotropic etch processes.

According to another aspect of the present disclosure, a memory device comprises a first electrically conductive line; a memory pillar structure comprising a lower electrode plate, a selector material plate, an upper electrode plate, a refractory metal-containing etch stop plate, a ruthenium etch stop plate, a conductive pillar, and a memory element and overlying the first electrically conductive line; and a second electrically conductive line overlying the memory pillar structure.

BRIEF DESCRIPTION OF THE DRAWINGS

FIG. 4A is a top-down view of the exemplary structure after patterning the metallic cap layer and the at least one memory material layer according to an embodiment of the present disclosure.

FIG. 4B is a vertical cross-sectional view of the exemplary structure along the vertical plane B-B' of FIG. 4A.

FIG. 4C is a vertical cross-sectional view of the exemplary structure along the vertical plane C-C' of FIG. 4A.

FIG. 5A is a top-down view of the exemplary structure after patterning the conductive material layer according to an embodiment of the present disclosure.

FIG. 5B is a vertical cross-sectional view of the exemplary structure along the vertical plane B-B' of FIG. 5A.

FIG. 5C is a vertical cross-sectional view of the exemplary structure along the vertical plane C-C' of FIG. 5A.

FIG. 8A is a top-down view of the exemplary structure after patterning the stack of the upper electrode layer, the optional upper metallic compound liner, the selector material layer, the optional lower metallic compound liner, and the lower electrode layer according to an embodiment of the present disclosure.

FIG. 8B is a vertical cross-sectional view of the exemplary structure along the vertical plane B-B' of FIG. 8A.

FIG. 8C is a vertical cross-sectional view of the exemplary structure along the vertical plane C-C' of FIG. 8A.

FIG. 10A is a top-down view of the exemplary structure after formation of second electrically conductive lines and second dielectric isolation rails according to an embodiment of the present disclosure.

FIG. 10B is a vertical cross-sectional view of the exemplary structure along the vertical plane B-B' of FIG. 10A.

FIG. 10C is a vertical cross-sectional view of the exemplary structure along the vertical plane C-C' of FIG. 10A.

DETAILED DESCRIPTION

Figure 1A:
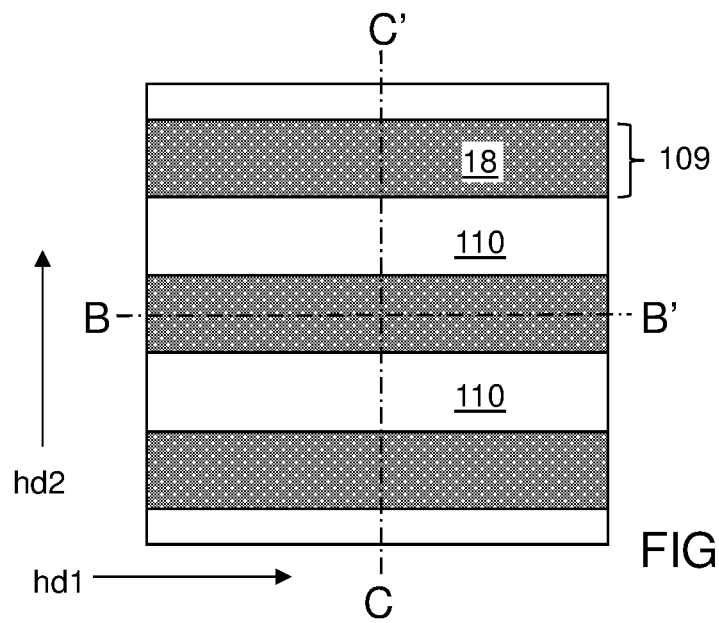
FIG. 1A is a top-down view of an exemplary structure for forming a cross-point memory device after formation of a dielectric etch stop layer, a first dielectric isolation layer, and first line trenches vertically extending through the first dielectric isolation layer according to an embodiment of the present disclosure.

Selector elements (also known as steering elements), such as ovonic threshold switch (OTS) selector elements, are used to select an individual memory cells in an array of memory cells. In this case, each memory cell includes a series connection of a memory element and a selector element. The present inventors realized that ovonic threshold switch materials can be degraded by exposure to fluorine containing plasma an anisotropic etch process, such as a reactive ion etch process. For example, exposure to fluorine containing plasma can increase the leakage current of ovonic threshold switch materials. However, fluorine-containing plasma is effective in etching various metallic materials of the memory cell that overly the ovonic threshold switch material. The methods and structures of the embodiments of the present disclosure utilize dual etch stop layers overlying the ovonic threshold switch selector to reduce or avoid exposure to fluorine-containing plasma that can damage the ovonic threshold switch selector. Specifically, dual etch stop layers including a stack of a ruthenium etch stop layer and a refractory metal-containing etch stop layer can be used to pattern the ovonic threshold switch selector in an MRAM device without significant exposure to fluorine-containing plasma.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Figure 1B:
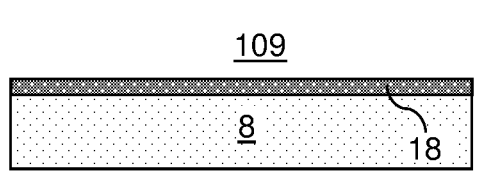
FIG. 1B is a vertical cross-sectional view of the exemplary structure along the vertical plane B-B' of FIG. 1A.
Figure 1C:
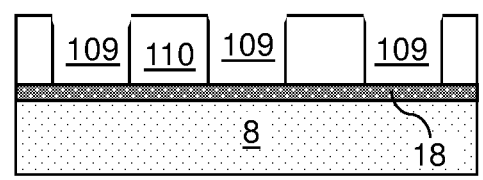
FIG. 1C is a vertical cross-sectional view of the exemplary structure along the vertical plane C-C' of FIG. 1A.

Referring to FIGS. 1A-1C, an exemplary structure for forming an array of memory elements containing OTS selectors is illustrated. While the memory elements comprise MRAM elements in a cross point array configuration, other memory elements and/or other array configurations may be used.

The array includes a substrate 8. The substrate 8 includes an insulating material layer in an upper portion, and may optionally include additional layers (not illustrated) underneath, which can include, for example, a semiconductor material layer and interconnect level dielectric layers embedding metal interconnect structures therein. In one embodiment, semiconductor devices such as field effect transistors may be provided on the semiconductor material layer, and the metal interconnect structures can provide electrically conductive paths among the semiconductor devices. The exemplary structure includes a memory array region, which is illustrated herein, and a peripheral region (not illustrated) including interconnect structures and/or peripheral devices. Memory cells are subsequently formed in the memory array region.

An optional dielectric etch stop layer 18 can be formed over the substrate 8. The dielectric etch stop layer 18 includes a dielectric material that can be employed as an etch stop material portion during a subsequent anisotropic etch process. For example, the dielectric etch stop layer 18 can include silicon nitride or a dielectric metal oxide (such as aluminum oxide). The thickness of the dielectric etch stop layer 18 can be in a range from 4 nm to 40 nm, although lesser and greater thicknesses can also be employed.

A first dielectric isolation layer 110 can be deposited over the optional dielectric etch stop layer 18. The first dielectric isolation layer 110 includes a dielectric material such as silicon oxide. The first dielectric isolation layer 110 can be formed by chemical vapor deposition. The thickness of the first dielectric isolation layer 110 may be in a range from 50 nm to 500 nm, although lesser and greater thicknesses can also be employed.

A photoresist layer (not shown) can be applied over the first dielectric isolation layer 110, and can be lithographically patterned to form a line and space pattern. Elongated openings laterally extending along a first horizontal direction hd1 and laterally spaced apart among one another along a second horizontal direction hd2 can be formed in the photoresist layer. The width of each opening along the second horizontal direction hd2 can be in a range from 10 nm to 50 nm, such as 15 nm to 25 nm, although lesser and greater widths can also be employed. The pitch of the line and space pattern may be in a range from 20 nm to 100 nm, such as from 30 nm to 50 nm, although lesser and greater pitches may also be employed.

The pattern in the photoresist layer can be transferred through the first dielectric isolation layer 110 by an anisotropic etch process. The photoresist layer can be employed as an etch mask during the anisotropic etch process. First line trenches 109 can be formed through the first dielectric isolation layer 110. The photoresist layer can be subsequently removed, for example, by ashing.

Figure 2A:
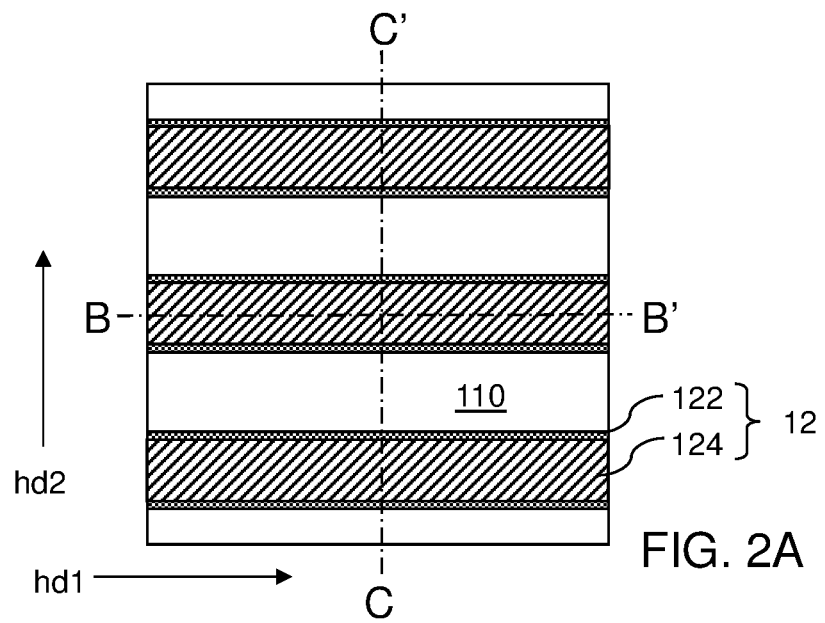
FIG. 2A is a top-down view of the exemplary structure after formation of first electrically conductive lines according to an embodiment of the present disclosure.
Figure 2B:
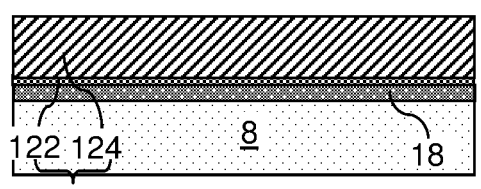
FIG. 2B is a vertical cross-sectional view of the exemplary structure along the vertical plane B-B' of FIG. 2A.
Figure 2C:
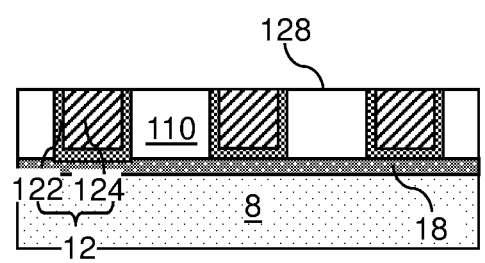
FIG. 2C is a vertical cross-sectional view of the exemplary structure along the vertical plane C-C' of FIG. 2A.

Referring to FIGS. 2A-2C, a metallic liner layer including a metallic barrier material can be deposited in the first line trenches 109 and over the first dielectric isolation layer 110. The metallic liner layer can include a conductive metallic barrier material such as a conductive metallic nitride material (e.g., TiN, TaN, and/or WN) and/or a conductive metallic carbide material (e.g., TiC, TaC, and/or WC). The metallic liner layer can be deposited by chemical vapor deposition or physical vapor deposition. A metallic fill material layer can be deposited over the metallic liner layer. The metallic fill material layer includes a metallic material having high electrical resistivity. For example, the metallic fill material layer can include copper, tungsten, titanium, tantalum, molybdenum, ruthenium, cobalt, or a combination thereof.

Excess portions of the metallic fill material layer and the metallic liner layer can be removed from above the horizontal plane including the top surface 128 of the first dielectric isolation layer 110. The horizontal plane including the surface 128 defines the boundary between the dielectric isolation layer 110 and subsequently deposited layers (e.g., layer 132L shown in FIGS. 3B and 3C and described below). Each remaining portion of the metallic fill material layer comprises a first metallic fill material portion 124. Each remaining portion of the metallic liner layer comprises a first metallic liner 122. Each contiguous combination of a first metallic liner 122 and a first metallic fill material portion 124 constitutes a first electrically conductive line 12 (e.g., word line or bit line). The first electrically conductive lines 12 laterally extend along the first horizontal direction hd1, and are laterally spaced apart along the second horizontal direction hd2. Alternatively, the first electrically conductive lines 12 may be formed first over the substrate 8, followed by forming the first dielectric isolation layer 110 between the first electrically conductive lines 12.

Figure 3A:
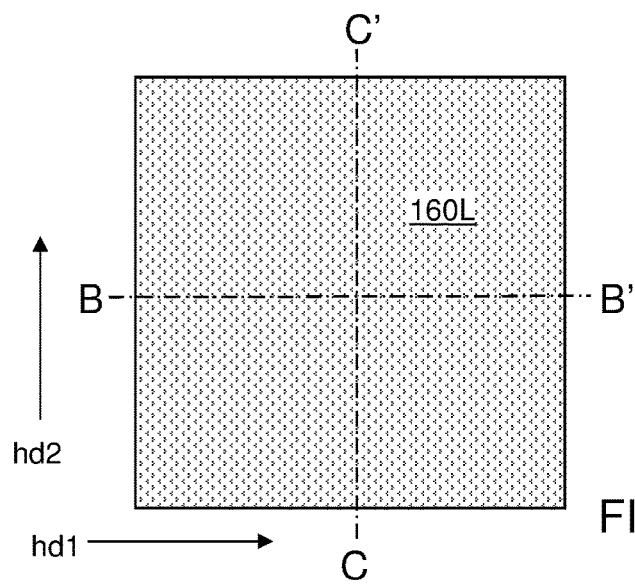
FIG. 3A is a top-down view of the exemplary structure after formation of a layer stack including a lower electrode layer, an optional lower metallic compound liner, a selector material layer, an optional upper metallic compound liner, an upper electrode layer, a refractory metal-containing etch stop layer, a ruthenium etch stop layer, a conductive material layer, at least one memory material layer, and a metallic cap layer according to an embodiment of the present disclosure.
Figure 3B:
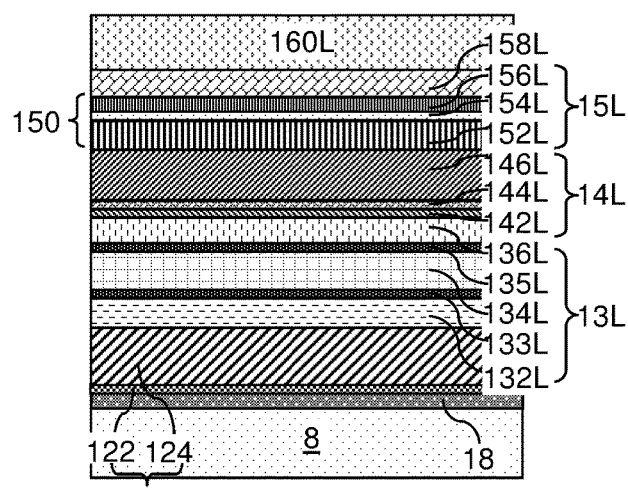
FIG. 3B is a vertical cross-sectional view of the exemplary structure along the vertical plane B-B' of FIG. 3A.
Figure 3C:
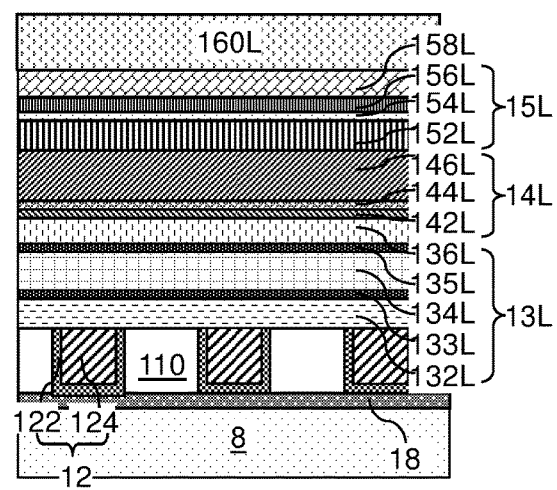
FIG. 3C is a vertical cross-sectional view of the exemplary structure along the vertical plane C-C' of FIG. 3A.

Referring to FIGS. 3A-3C, a layer stack can be formed over the first electrically conductive lines 12 and he first dielectric isolation layer 110. The layer stack can include, from bottom to top, including a selector layer stack 13L, an etch stop layer stack 14L, at least one memory material layer 15L, and an optional metallic cap layer 158L.

The selector layer stack 13L can include, from bottom to top, a lower electrode layer 132L, an optional lower metallic compound liner 133L, a selector material layer 134L, an optional upper metallic compound liner 135L, and an upper electrode layer 136L. Each of the lower electrode layer 132L and the upper electrode layer 136L includes at least one electrically conductive material. The at least one electrically conductive material may include a non-metallic conductive material. Exemplary non-metallic conductive materials that can be employed for the lower electrode layer 132L and the upper electrode layer 136L include amorphous carbon, amorphous boron-doped carbon, amorphous nitrogen-doped carbon, metal-carbon alloys or other carbon alloys, and layer stacks thereof. Each of the lower electrode layer 132L and the upper electrode layer 136L may be free of transition metal elements. Each of the lower electrode layer 132L and the upper electrode layer 136L may be deposited by chemical vapor deposition, physical vapor deposition, or atomic layer deposition. Each of the lower electrode layer 132L and the upper electrode layer 136L can have a respective thickness in a range from 1 nm to 10 nm, such as from 2 nm to 5 nm, although lesser and greater thicknesses may also be employed.

Each of the optional lower metallic compound liner 133L and the optional upper metallic compound liner 135L, if present, can include a conductive metallic compound material that can function as a diffusion barrier material. Exemplary conductive metallic compound materials that can be employed for the optional lower metallic compound liner 133L and the optional upper metallic compound liner 135L include conductive metallic nitride materials (such as WN, TaN, and/or TiN) and conductive metallic carbide materials (such as WC, TaC, and/or TiC). Each of the lower metallic compound liner 133L and the upper metallic compound liner 135L may be deposited by chemical vapor deposition, physical vapor deposition, or atomic layer deposition. Each of the lower metallic compound liner 133L and the upper metallic compound liner 135L can have a respective thickness in a range from 0.5 nm to 4 nm, such as from 1 nm to 2 nm, although lesser and greater thicknesses may also be employed.

The selector material layer 134L includes a material that can function as a voltage-dependent switch. Generally, the selector material layer 134L can include a threshold switch material which exhibits non-linear electrical behavior, such as an ovonic threshold switch material.

As used herein, an ovonic threshold switch (OTS) material is a material that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. The chalcogenide material may be a GeTe compound or a Ge—Se compound doped with a dopant selected from As, N, and C, such as a Ge—Se—As compound semiconductor material. The ovonic threshold switch material layer can include a selector material layer 134L which contains any ovonic threshold switch material. In one embodiment, the selector material layer 134L can include, and/or can consist essentially of, a GeSeAs alloy, a GeSe alloy, a SeAs alloy, a GeTe alloy, or a SiTe alloy.

In one embodiment, the material of the selector material layer 134L can be selected such that the resistivity of the selector material layer 134L decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer 134L can be selected such that the critical bias voltage magnitude can be in a range from 1 V to 4 V, although lesser and greater voltages can also be employed for the critical bias voltage magnitude. The thickness of the selector material layer 134L can be, for example, in a range from 5 nm to 40 nm, such as 10 nm to 20 nm, although lesser and greater thicknesses can also be employed.

The etch stop layer stack 14L can include, from bottom to top, a refractory metal-containing etch stop layer 142L, a ruthenium etch stop layer 144L, and a conductive material layer 146L. The refractory metal-containing etch stop layer 142L includes a refractory metal-containing material that comprises at least one refractory metal. As used herein, refractory metals refer to five transition metal elements consisting of tantalum, tungsten, rhenium, niobium, and molybdenum. The refractory metal-containing etch stop layer 142L can include at least one refractory metal in an elemental form, in the form of an intermetallic alloy, or in the form of a conductive metallic compound with at least one non-metallic element (such as TaN, WN, TaC, or WC). In one embodiment, the refractory metal-containing etch stop layer 142L may consist essentially of tantalum, tungsten, rhenium, niobium, molybdenum, intermetallic alloys thereof, or conductive metallic nitride materials thereof. In one embodiment, the refractory metal-containing etch stop layer 142L may consist essentially of tantalum nitride. The refractory metal-containing etch stop layer 142L can be deposited by physical vapor deposition or chemical vapor deposition. The thickness of the refractory metal-containing etch stop layer 142L can have a thickness in a range from 2 nm to 5 nm, such as from 2 nm to 3 nm. The thickness of the refractory metal-containing etch stop layer 142L is selected such that the refractory metal-containing etch stop layer 142L is thick enough to function as an etch stop structure for an etch process that etches the ruthenium etch stop layer 144L, and is thin enough to be etched by a timed anisotropic etch process without etching through the entire underlying upper electrode layer 136L.

The ruthenium etch stop layer 144L can consist essentially of ruthenium. Ruthenium can be etched in an anisotropic etch process employing chlorine-based plasma, such as a chlorine and oxygen containing plasma, and is resistant to fluorine-based plasma that can etch refractory metals and other metallic materials. Thus, ruthenium can be employed as an etch stop material for an anisotropic etch process that etches the material of the conductive material layer 146L. The ruthenium etch stop layer 144L can be deposited, for example, by atomic layer deposition or physical vapor deposition. The thickness of the ruthenium etch stop layer 144L may be in a range from 2 nm to 5 nm, such as from 2 nm to 3 nm. The thickness of the ruthenium etch stop layer 144L is selected such that the ruthenium etch stop layer 144L is thick enough to function as an etch stop structure for an etch process that etches the conductive material layer 146L, and is thin enough to be etched by an anisotropic etch process with minimum collateral etch into the refractory metal-containing etch stop layer 142L.

The conductive material layer 146L comprises, and/or consists essentially of, a material selected from an elemental metal other than ruthenium, an intermetallic alloy other than ruthenium-containing alloys, a conductive metallic nitride material, a conductive metallic carbide material, and a conductive carbon-based material. Exemplary elemental metals that can be employed for the conductive material layer 146L include refractory elemental metals (such as tantalum, tungsten, rhenium, niobium, and molybdenum) and non-refractory transition metals such as titanium. Exemplary conductive metallic nitride materials include TiN, TaN, and WN. Exemplary conductive metallic carbide materials include TiC, TaC, and WC. Conductive carbon-based materials include amorphous carbon or diamond-like carbon doped with suitable dopant atoms such as nitrogen to increase the electrical conductivity. In one embodiment, the conductive material layer 146L can include a tantalum-containing compound material. For example, the conductive material layer 146L can consist essentially of tantalum nitride. The conductive material layer 146L can be formed by physical vapor deposition or chemical vapor deposition. The thickness of the conductive material layer 146L can be in a range from 20 nm to 50 nm, such as from 30 nm to 40 nm, although lesser and greater thicknesses can also be employed.

The at least one memory material layer 15L includes at least one memory material that can be patterned into memory elements. In one embodiment, the at least one memory material layer 15L can comprises a vertical stack of magnetic junction material layers, i.e., a stack of material layers for forming a magnetic tunnel junction (MTJ) or a spin valve for an MRAM memory cell. For example, the at least one memory material layer 15L can include a stack of material layers including, from bottom to top or from top to bottom, a reference layer 152L (which is also referred to as a magnetic pinned layer), a tunnel barrier layer 154L, and a free layer 156L, which together form an MTJ 150 of an STT MRAM memory cell. The thickness of the MTJ can be in a range from 10 nm to 40 nm, such as 20 nm to 30 nm.

The reference layer 152L can have a fixed magnetization direction which can be a horizontal direction or a vertical direction. The reference layer 152L can be formed as single ferromagnetic material layer or multiple ferromagnetic material layers that are magnetically coupled among one another to provide a same magnetization direction throughout. The reference layer 152L may include a Co/Ni multilayer structure or a Co/Pt multilayer structure. In one embodiment, the reference layer 152L can additionally include a thin non-magnetic layer comprised of tantalum or tungsten having a thickness in a range from 0.2 nm to 0.5 nm and a thin CoFeB layer having a thickness in a range from 0.5 nm to 3 nm. The thickness of the reference layer 152L can be in a range from 2 nm to 5 nm.

Optionally, the reference layer 152L may be provided in a synthetic antiferromagnet (SAF) structure that includes a hard magnetization layer (not expressly shown), an antiferromagnetic coupling layer (e.g., a Ru layer, not expressly shown), and the reference layer 152L. In case the reference layer 152L is provided as a component of an SAF structure, the magnetization of the hard magnetization layer and the magnetization of the magnetic pinned layer can be antiferromagnetically coupled through the antiferromagnetic coupling layer.

The tunnel barrier layer 154L can include a tunnel barrier dielectric material such as magnesium oxide or aluminum oxide. The tunnel barrier layer 154L can have a thickness in a range from 0.6 nm to 2 nm, such as from 0.8 nm to 1.2 nm. The tunnel barrier layer 154L contacts the reference layer 152L, and provides spin-sensitive tunneling of electrical currents between the reference layer 152L and the free layer 156L. In other words, the amount of electrical current that passes through the tunnel barrier layer 154L depends on the relative alignment of magnetization between the reference layer 152L and the free layer 156L, i.e., whether the magnetization directions are parallel or antiparallel to each other.

The free layer 156L can be formed as single ferromagnetic material layer or multiple ferromagnetic material layers that are magnetically coupled among one another to provide a same magnetization direction throughout. The thickness of the free layer 156L is less than 2 nm, and preferably less than 1.5 nm, such as from 0.8 nm to 1.5 nm. For example, the free layer 156L can include a CoFeB layer and/or a CoFe layer. The free layer 156L can be programmed by flowing electrical current along a vertical direction either upward or downward. Additional layers (not shown) may be included in the MTJ 150.

The metallic cap layer 158L includes a nonmagnetic metallic material such as at least one nonmagnetic transition metal or a nonmagnetic transition metal alloy. For example, the metallic cap layer 158L may include, and or may consist essentially of, Ti, V, Cr, Mn, Zr, Nb, Mo, Tc, Ru, Rh, Hf, Ta, W, Re, Os, Jr, alloys thereof, and a conductive metallic nitride or a conductive metallic carbide thereof. The metallic cap layer 158L maybe deposited by physical vapor deposition or chemical vapor deposition. The thickness of the metallic cap layer 158L may be in a range from 1 nm to 20 nm, such as from 2 nm to 10 nm, although lesser and greater thicknesses can also be employed.

In alternative embodiment, the at least one memory material layer 15L is not limited to an MRAM memory cell layer, and can include any memory material, i.e., a material that can be programmed to have at least two different memory states. In one embodiment, the at least one memory material layer 15L includes a resistive memory material. As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance In one embodiment, the at least one memory material layer 15L includes a phase change memory material to form a phase change random access memory ("PCRAM" or "PRAM") device. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the resistive memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. In this case, the thickness of the at least one memory material layer 15L can be in a range from 1 nm to 60 nm, such as from 3 nm to 40 nm and/or from 10 nm to 25 nm, although lesser and greater thicknesses can also be employed.

In another embodiment, the at least one memory material layer 15L includes a barrier modulated cell memory material. For example, oxygen-vacancy-containing metal oxides displaying different electrical conductivity characteristics depending on the level of oxygen vacancies can be deposited for the at least one memory material layer 15L. An oxygen-vacancy-containing metal oxide can be formed with oxygen deficiencies (e.g., vacancies), or can be annealed to form oxygen deficiencies. One of the electrodes of such a memory device can include a high work function material having a work function greater than 4.5 eV, and can be employed to provide a high potential barrier for electrons at the interface with the reversibly resistance-switching material. As a result, at moderate voltages (below one volt), a very low current will flow through the reversibly resistance-switching material. The energy barrier at the interface between the electrode and the reversibly resistance-switching material can be lowered by the presence of the oxygen vacancies ($V_O^{..}$). In this case, the interface between the electrode and the reversibly resistance-switching material can provide the characteristics of a low resistance contact (Ohmic contact). The oxygen vacancies in the metal oxide of the reversibly resistance-switching material function as n-type dopants, thereby transforming the originally insulating metal oxide into an electrically insulating material having a lower resistivity (but still insulating).

When a large forward bias voltage (such as a negative voltage of about −1.5 volt that is applied to the high work function electrode with respect to the opposing electrode) is applied across the reversibly resistance-switching material, the oxygen vacancies drift toward the interface between the high energy barrier material (such as platinum or n-doped polysilicon) and the reversibly resistance-switching material, and as a result, the potential barrier at the interface between the electrode and the reversibly resistance-switching material is reduced and a relatively high current can flow through the structure. The device is then in its low resistance (conductive) state in which the reversibly resistance-switching material functions as a semiconducting material or a conductive material.

The conductive path can be broken by applying a large reverse bias voltage (such as a positive voltage of about 1.5 volt that is applied to the electrode with respect to the lower electrode) across the reversibly resistance-switching material. Under a suitable reverse bias condition, the oxygen vacancies move away from the proximity of the interface between the high work function material and the reversibly resistance-switching material. The resistivity of the reversibly resistance-switching material returns to its high resistance state. Both of the conductive and non-conductive states are non-volatile. Sensing the conduction of the memory storage element (for example, by applying a voltage around 0.5 volts) can easily determine the state of the resistive memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile resistive memory elements include hafnium oxide, such as $HfO_x$ where $1.9<x<2.1$. Suitable materials for the lower electrode (e.g., word line) are any conducting material such as Ti(O)N, Ta(O)N, TiN, TiAlN, WN and TaN. Suitable materials for the electrode (e.g., local bit line) include metals and doped semiconductor with a high work function (typically >4.5 eV) capable to getter oxygen in contact with the metal oxide to create oxygen vacancies at the contact. Some examples are TaCN, TiCN, Ru, $RuO_2$, Pt, Ti rich $TiO_x$, TiAlN, TaAlN, TiSiN, TaSiN, $IrO_2$ and doped polysilicon. The thicknesses of the electrodes are typically 1 nm or greater. Thicknesses of the metal oxide can be generally in the range of 2 nm to 20 nm.

In yet another embodiment, the resistive memory material employed for the at least one memory material layer 15L can include a filamentary metal oxide material such as nickel oxide or $TiO_2$, in which electrically conductive filamentary paths can be formed or removed depending on the external electrical bias conditions. In this case, the at least one memory material layer 15L can optionally include a first lower electrically conductive liner layer (such as a lower TiN liner) underlying a resistive memory material layer and a first upper electrically conductive liner layer (such as an upper TiN liner) overlying the resistive memory material layer.

A mask layer 160L, such as an ion milling mask material layer 160L can be deposited over the metallic cap layer 158L, for an MRAM memory device. The ion milling mask material layer 160L includes a material that may be employed as a mask material for an ion milling process to be subsequently employed. For example, the ion milling mask material layer 160L may include diamond-like carbon (DLC). The thickness of the ion milling mask material layer 160L may be in a range from 15 nm to 60 nm, such as from 20 m to 40 nm, although lesser and greater thicknesses can also be employed.

Referring to FIGS. 4A-4C, an optional photoresist layer (now shown) can be applied over the ion milling mask material layer 160L, and can be lithographically patterned to form a two-dimensional array of discrete photoresist material portions. An anisotropic etch process can be performed to transfer the pattern of the two-dimensional array of discrete photoresist material portions through the ion milling mask material layer 160L. The patterned portions of the ion milling mask material layer 160L form a two-dimensional array of mask material portions 160, which may be arranged as a two-dimensional periodic array such as a rectangular array. The pitch of the two-dimensional array of the mask material portions 160 along the second horizontal direction hd2 may be the same as the pitch of the first electrically conductive lines 12 along the second horizontal direction hd2. The photoresist layer can be subsequently removed, for example, by ashing.

An ion milling process can be performed to remove unmasked portions of the metallic cap layer 158L and the at least one memory material layer 15L. The array of mask material portions 160 can be employed as an ion milling mask during the ion milling process. The metallic cap layer 158L can be patterned into a two-dimensional array of metallic cap plates 158. The at least one memory material layer 15L can be patterned into an array of memory elements 15. In case the at least one memory material layer 15L includes a layer stack of the reference layer 152L, the tunnel barrier layer 154L, and the free layer 156L, each memory element 15 can include an MTJ 150 comprising a layer stack of a reference layer 152, a tunnel barrier layer 154, and a free layer 156. Each reference layer 152 can be a patterned portion of the reference layer 152L as formed in the processing steps of FIGS. 3A-3C. Each tunnel barrier layer 154 can be a patterned portion of the tunnel barrier layer 154L as formed in the processing steps of FIGS. 3A-3C. Each free layer 156 can be a patterned portion of the free layer 156L as formed in the processing steps of FIGS. 3A-3C. The top surface of the conductive material layer 146L can be physically exposed after the ion milling process.

Each memory element 15 can have a pillar shape. The pillar shape can have at least one tapered sidewall due to the ion milling induced taper. In case the pillar shape has at least one tapered sidewall, the taper angle of the at least one tapered sidewall can be in a range from 1 degree to 30 degrees, such as from 3 degrees to 15 degrees, although lesser and greater taper angles can also be employed. The horizontal cross-sectional shape of each pillar structure may be circular, elliptical, rectangular, of a rounded rectangle, and/or of a two-dimensional generally curvilinear closed shaped. The at least one conductive material layer 146L acts as an ion milling buffer, and may be partially recessed during the ion milling.

Referring to FIGS. 5A-5C, a first anisotropic etch process can be performed to etch the remaining unmasked portions of the conductive material layer 146L. The chemistry of the first anisotropic etch process can be selected such that the first anisotropic etch process etches the material of the conductive material layer 146L selective to ruthenium, i.e., selective to the material of the ruthenium etch stop layer 144L. In one embodiment, the selectivity of the first anisotropic etch process relative to ruthenium may be in a range from 3 to 100, such as from 5 to 20. In other words, the ratio of the etch rate of the material of the conductive material layer 146L to the etch rate of ruthenium during the first anisotropic etch process may be in a range from 3 to 100, such as from 5 to 30. In one embodiment, the first anisotropic etch process can employ a plasma of a chlorine-free etch gas. For example, if the conductive material layer 146L includes a refractory metal or a refractory metal nitride (e.g., TaN), then first anisotropic etch process can employ a fluorine-based plasma generated from an etch gas that is free of chlorine. Exemplary chlorine-free etch gases include hydrofluorocarbon etch gases ($C_xH_yF_z$) such as $CHF_3$. Alternatively, if the conductive material layer 146L includes doped or undoped carbon, then an oxygen plasma employed during the first anisotropic etch process. The first anisotropic etch process can include an overetch step to ensure that all unmasked portions of the conductive material layer 146L are removed by the first anisotropic etch process. Thus, collateral etching of the top portions of the ruthenium etch stop layer 144L may occur during the terminal portion of the first anisotropic etch process. The duration of the first anisotropic etch process can be selected such that the ruthenium etch stop layer 144L is not etched all the way through by the first anisotropic etch. process. Each patterned portion of the conductive material layer 146L comprises a conductive pillar 146. The conductive pillars 146 can have a lesser taper angle than the taper angle of sidewalls of the memory elements 15 and can be wider (e.g., have a greater width, such as a greater diameter) than the width of the overlying MTJ 150, such as greater width than the width of the tunnel barrier layer 154. For example, the sidewalls of the conductive pillars 146 can be substantially vertical, or may have a taper angle in a range from 0.1 degree to 5 degrees.

Figure 6A:
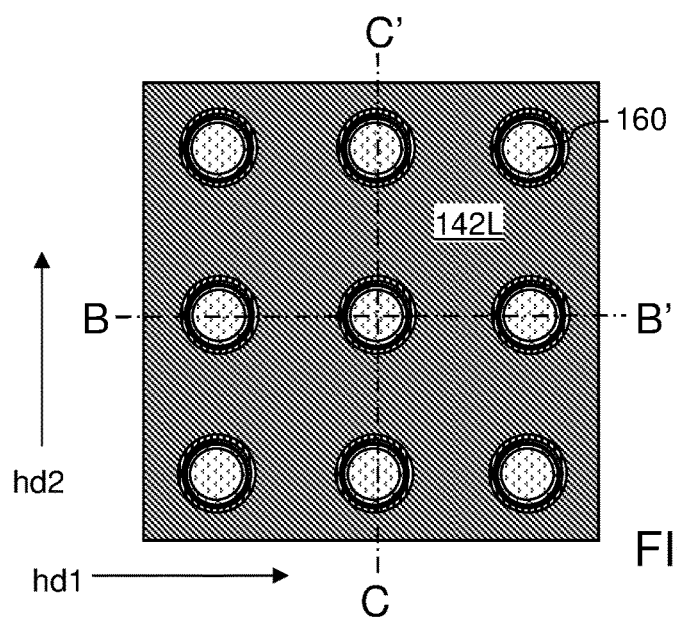
FIG. 6A is a top-down view of the exemplary structure after patterning the ruthenium etch stop layer according to an embodiment of the present disclosure.
Figures 6B, 6C:
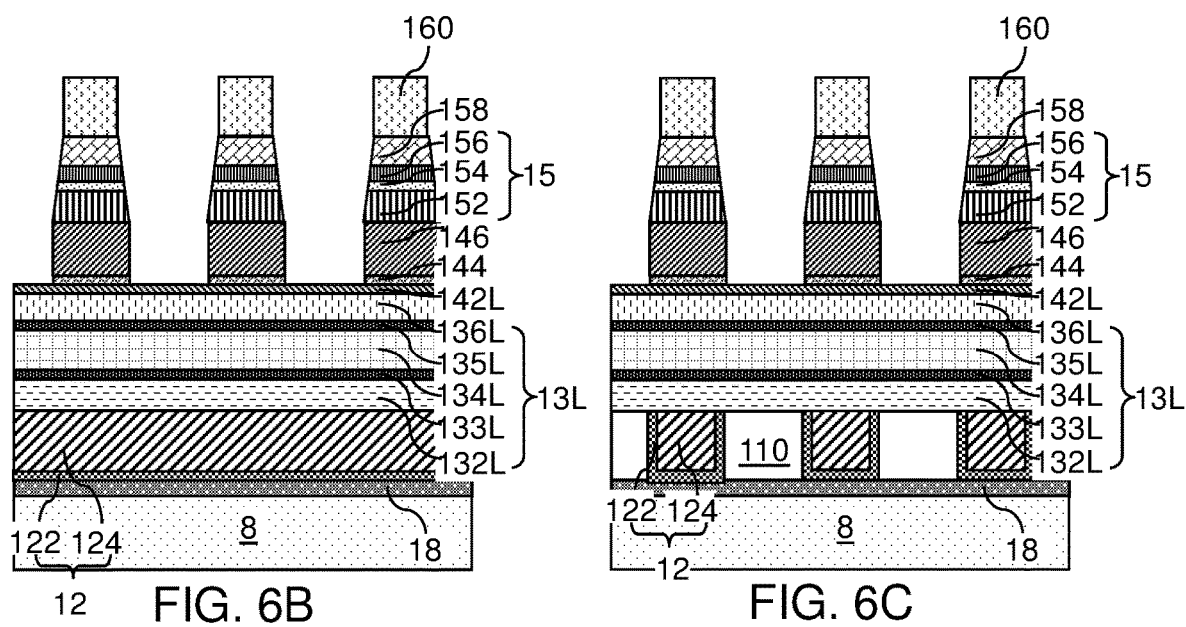
FIG. 6B is a vertical cross-sectional view of the exemplary structure along the vertical plane B-B' of FIG. 6A.
FIG. 6C is a vertical cross-sectional view of the exemplary structure along the vertical plane C-C' of FIG. 6A.

Referring to FIGS. 6A-6C, a second anisotropic etch process can be performed to etch unmasked portions of the ruthenium etch stop layer 144L. The chemistry of the second anisotropic etch process can be selected such that the second anisotropic etch process etches ruthenium selective to the material of the refractory metal-containing etch stop layer 142L. In one embodiment, the selectivity of the second anisotropic etch process relative to the material of the refractory metal-containing etch stop layer 142L may be in a range from 2 to 100, such as from 4 to 20. In other words, the ratio of the etch rate of ruthenium to the etch rate of the refractory metal-containing etch stop layer 142L during the second anisotropic etch process may be in a range from 2 to 100, such as from 4 to 30. In one embodiment, the second anisotropic etch process can employ a plasma of a chlorine-containing etch gas. For example, the second anisotropic etch process can employ a chlorine-based plasma generated from an etch gas that includes chlorine. Exemplary chlorine-containing etch gases include $Cl_2$ and $BCl_3$. Oxygen and/or argon may be employed during the second anisotropic etch process, such that $Cl_2$ and $O_2$ etch gases are used to etch the ruthenium etch stop layer 144L. The second anisotropic etch process can include an overetch step to ensure that all unmasked portions of the ruthenium etch stop layer 144L are removed by the second anisotropic etch process. Thus, collateral etching of the top portions of the refractory metal-containing etch stop layer 142L may occur during the terminal portion of the second anisotropic etch process. The duration of the second anisotropic etch process can be selected such that the refractory metal-containing etch stop layer 142L is not etched all the way through by the second anisotropic etch process. Each patterned portion of the ruthenium etch stop layer 144L comprises a ruthenium etch stop plate 144. The ruthenium etch stop plates 144 can have a lesser taper angle than the taper angle of sidewalls of the memory elements 15. For example, the sidewalls of the ruthenium etch stop plates 144 can be substantially vertical, or may have a taper angle in a range from 0.1 degree to 5 degrees.

Figure 7A:
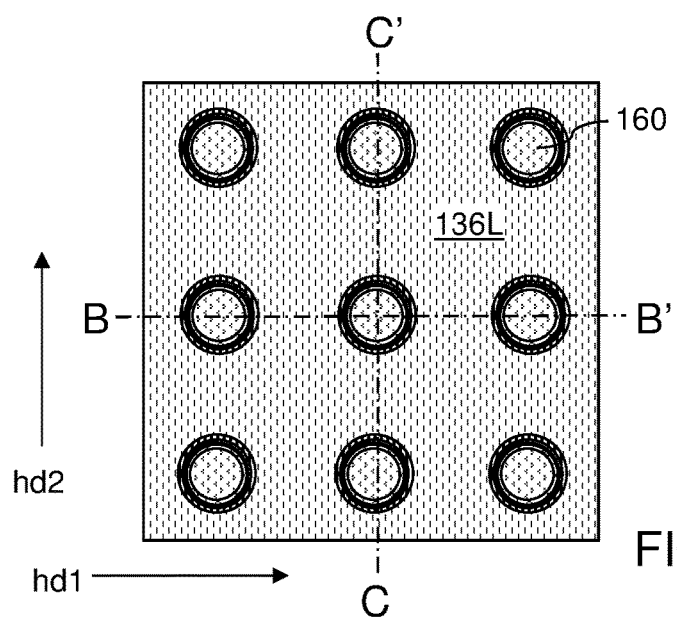
FIG. 7A is a top-down view of the exemplary structure after patterning the refractory metal-containing etch stop layer according to an embodiment of the present disclosure.
Figure 7B:
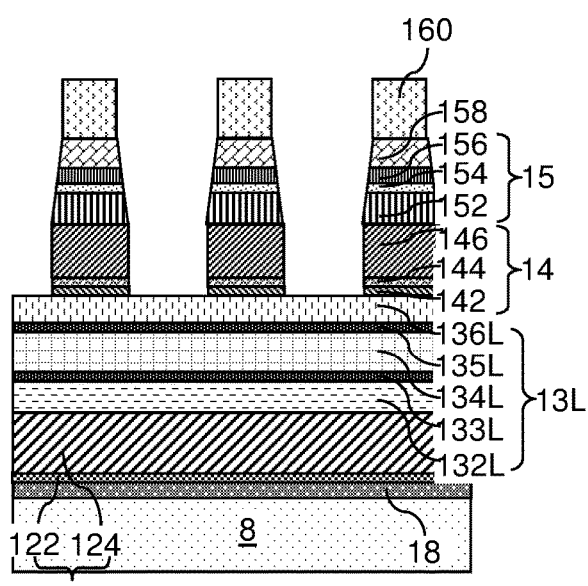
FIG. 7B is a vertical cross-sectional view of the exemplary structure along the vertical plane B-B' of FIG. 7A.
Figure 7C:
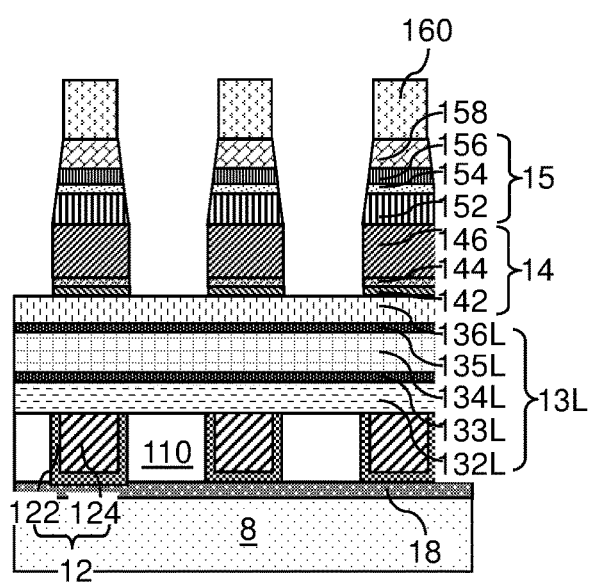
FIG. 7C is a vertical cross-sectional view of the exemplary structure along the vertical plane C-C' of FIG. 7A.

Referring to FIGS. 7A-7C, a third anisotropic etch process can be performed to etch unmasked portions of the refractory metal-containing etch stop layer 142L. The chemistry of the third anisotropic etch process can be selected such that the third anisotropic etch process etches the material of the refractory metal-containing etch stop layer 142L selective to the material of the upper electrode layer 136L. In one embodiment, the selectivity of the third anisotropic etch process relative to the material of the upper electrode layer 136L may be in a range from 1.5 to 10, such as from 2 to 5. In other words, the ratio of the etch rate of the material of the refractory metal-containing etch stop layer 142L to the etch rate of the material of the upper electrode layer 136L during the third anisotropic etch process may be in a range from 1.5 to 10, such as from 2 to 5. In one embodiment, the third anisotropic etch process can employ a plasma of a chlorine-free etch gas. For example, the third anisotropic etch process can employ a fluorine-based plasma generated from an etch gas that is free of chlorine. Exemplary chlorine-free etch gases include hydrofluorocarbon etch gases ($C_xH_yF_z$) such as $CHF_3$. Oxygen and/or argon may be employed during the third anisotropic etch process. The third anisotropic etch process can be a timed etch process with sufficient duration to ensure that all unmasked portions of the refractory metal-containing etch stop layer 142L are removed by the third anisotropic etch process. Thus, collateral etching of the top portions of the upper electrode layer 136L may occur during the terminal portion of the third anisotropic etch process. The duration of the third anisotropic etch process can be selected such that less than 10 nm, such as 1-2 nm, of the upper electrode layer 136L is etched, and the upper electrode layer 136L is not etched all the way through by the third anisotropic etch process to avoid damaging the underlying OTS the selector material layer 134L with the fluorine plasma. Therefore, the dual etch stop layer (144L, 142L) prevents the upper electrode layer 136L from being etched all the way through, such that the OTS selector element layer 134L is not exposed to damaging fluorine plasma used to etched layer 146L. This means that the upper electrode layer 136L does not have to act as an etch stop for a deep fluorine plasma etch and the upper electrode layer 136L thickness may be reduced. The reduced thickness decreases the stress on the underlying layers and chance of delamination of the upper electrode layer 136L during annealing steps, such as an annealing step used to improve the quality of the MTJ 150.

Each patterned portion of the refractory metal-containing etch stop layer 142L comprises a refractory metal-containing etch stop plate 142. The refractory metal-containing etch stop plates 142 can have a lesser taper angle than the taper angle of sidewalls of the memory elements 15. For example, the sidewalls of the refractory metal-containing etch stop plates 142 can be substantially vertical, or may have a taper angle in a range from 0.1 degree to 5 degrees. Each vertical stack of a refractory metal-containing etch stop plate 142, a ruthenium etch stop plate 144, and a conductive pillar 146 is herein referred to as a conductive plate stack 14.

Referring to FIGS. 8A-8C, an additional anisotropic etch process can be performed to etch through unmasked portions of the selector layer stack 13L. The selector layer stack 13L include, from top to bottom, the upper electrode layer 136L, the optional upper metallic compound liner 135L, the selector material layer 134L, the optional lower metallic compound liner 133L, and the lower electrode layer 132L. The additional anisotropic etch process can include a plurality of anisotropic etch steps including a respective etch chemistry for etching a respective material layer within the selector layer stack 13L.

In an illustrative example, the upper electrode layer 136L and the optional upper metallic compound liner 135L may be etched by an anisotropic etch step employing an oxygen plasma if the liner 135L is sufficiently thin. The selector material layer 134L may be etched by an anisotropic etch step employing a plasma of a fluorine-free etch gas. In one embodiment, the fluorine-free etch gas employed for the anisotropic etch step for etching the selector material layer 134L may be a plasma of a bromine-containing etch gas (such as HBr or $Br_2$) or plasma of methane or another hydrocarbon gas. The lower electrode layer 132L and the optional lower metallic compound liner 133L may be etched by an anisotropic etch step employing an oxygen plasma if the liner 133L is sufficiently thin.

Each patterned portion of the upper electrode layer 136L comprises an upper electrode plate 136. Each patterned portion of the upper metallic compound liner 135L (if present) comprises an upper metallic compound plate 135. Each patterned portion of the selector material layer 134L comprises a selector material plate 134, such as an OTS selector material plate 134. Each patterned portion of the lower metallic compound liner 133L comprises a lower metallic compound plate 133. Each patterned portion of the lower electrode layer 132L comprises a lower electrode plate 132. Each vertical stack of an upper electrode plate 136, an optional upper metallic compound plate 135, a selector material plate 134, an optional lower metallic compound plate 133, and a lower electrode plate 132 constitute a selector element 13.

Memory pillar structures (13, 14, 15, 158) are provided over the first electrically conductive lines 12. Each of the memory pillar structures (13, 14, 15, 158) can include a selector element 13, a conductive plate stack 14, a memory element 15, and a metallic cap plate 158. The memory pillar structures (13, 14, 15, 158) can be arranged as a periodic two-dimensional array such as a rectangular array.

Figure 9A:
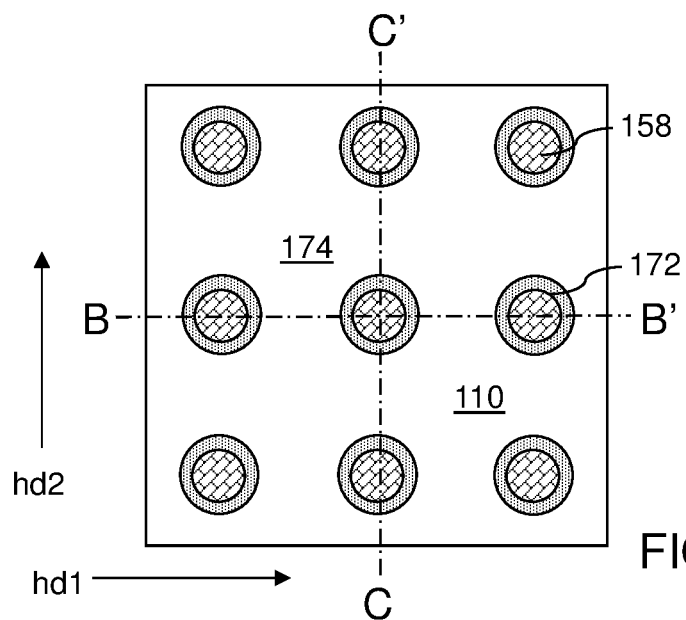
FIG. 9A is a top-down view of the exemplary structure after formation of a dielectric isolation structure according to an embodiment of the present disclosure.
Figure 9B:
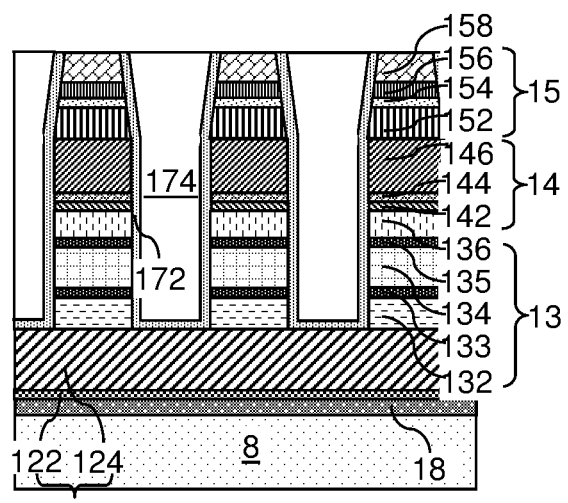
FIG. 9B is a vertical cross-sectional view of the exemplary structure along the vertical plane B-B' of FIG. 9A.
Figure 9C:
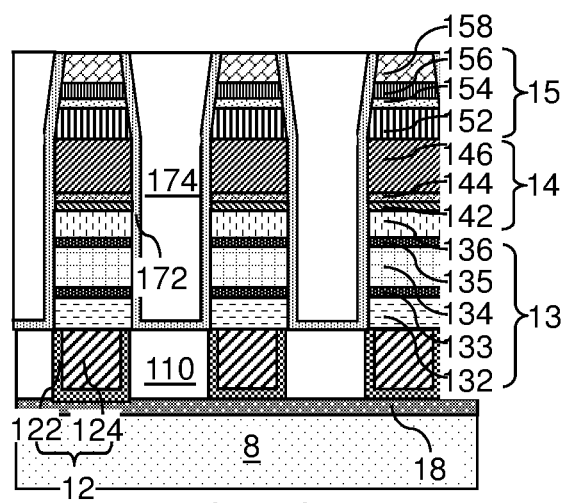
FIG. 9C is a vertical cross-sectional view of the exemplary structure along the vertical plane C-C' of FIG. 9A.

Referring to FIGS. 9A-9C, the two-dimensional array of mask material portions 160 can be removed, for example, by ashing. At least one dielectric material can be deposited over, and between, the memory pillar structures (13, 14, 15, 158). Excess portions of the at least one dielectric material can be removed from above the horizontal plane including the top surfaces of the memory pillar structures (13, 14, 15, 158) by a planarization process such as a chemical mechanical planarization (CMP) process. Remaining portions of the at least one dielectric material comprises a dielectric isolation structure (172, 174). The dielectric isolation structure (172, 174) can include an optional dielectric liner 172 and a dielectric fill material portion 174. The optional dielectric liner 172 includes a dielectric diffusion barrier material such as silicon nitride. The thickness of the dielectric liner 172 can be in a range from 3 nm to 10 nm, although lesser and greater thicknesses can also be employed. The dielectric fill material portion 174 includes a planarizable dielectric material such as undoped silicate glass or a doped silicate glass.

Referring to FIGS. 10A-10C, a second dielectric isolation layer 210 can be deposited over the two-dimensional array of memory pillar structures (13, 14, 15, 158). The second dielectric isolation layer 210 includes a dielectric material such as silicon oxide. The second dielectric isolation layer 210 can be formed by chemical vapor deposition. The thickness of the second dielectric isolation layer 210 may be in a range from 50 nm to 500 nm, although lesser and greater thicknesses can also be employed.

A photoresist layer (not shown) can be applied over the second dielectric isolation layer 210, and can be lithographically patterned to form a line and space pattern. Elongated openings laterally extending along the second horizontal direction hd2 and laterally spaced apart among one another along the first horizontal direction hd1 can be formed in the photoresist layer. The width of each opening along the first horizontal direction hd1 can be in a range from 10 nm to 50 nm, such as 15 nm to 25 nm, although lesser and greater widths can also be employed. The pitch of the line and space pattern along the first horizontal direction hd1 can be the same as the pitch of the two-dimensional array of memory pillar structures (13, 14, 15, 158) along the first horizontal direction hd1. The pitch of the line and space pattern may be in a range from 20 nm to 100 nm, such as from 30 nm to 50 nm, although lesser and greater pitches may also be employed.

The pattern in the photoresist layer can be transferred through the second dielectric isolation layer 210 by an anisotropic etch process. The photoresist layer can be employed as an etch mask during the anisotropic etch process. Second line trenches can be formed through the second dielectric isolation layer 210. The photoresist layer can be subsequently removed, for example, by ashing.

A metallic liner layer including a metallic barrier material can be deposited in the second line trenches and over the second dielectric isolation layer 210. The metallic liner layer can include a conductive metallic barrier material such as a conductive metallic nitride material (e.g., TiN, TaN, and/or WN) and/or a conductive metallic carbide material (e.g., TiC, TaC, and/or WC). The metallic liner layer can be deposited by chemical vapor deposition or physical vapor deposition. A metallic fill material layer can be deposited over the metallic liner layer. The metallic fill material layer includes a metallic material having high electrical resistivity. For example, the metallic fill material layer can include copper, tungsten, titanium, tantalum, molybdenum, ruthenium, cobalt, or a combination thereof.

Excess portions of the metallic fill material layer and the metallic liner layer can be removed from above the horizontal plane including the top surface of the second dielectric isolation layer 210. Each remaining portion of the metallic fill material layer comprises a second metallic fill material portion 224. Each remaining portion of the metallic liner layer comprises a second metallic liner 222. Each contiguous combination of a second metallic liner 222 and a second metallic fill material portion 224 constitutes a second electrically conductive line 22 (e.g., the other one of a bit line or word line). The second electrically conductive lines 22 laterally extend along the second horizontal direction hd2. and are laterally spaced apart along the first horizontal direction hd1. Alternatively, the second electrically conductive lines 22 may be formed first, followed by forming the second dielectric isolation layer 210 second electrically conductive lines 22.

While in the prior embodiment the memory element 15 overlies the selector element 13, embodiments are expressly contemplated herein in which the selector element 13 overlies a memory element 15. In this case, the conductive plate stack 14 can overlie the memory element 15 and the selector element 13.

Referring to all drawings and according to various embodiments of the present disclosure, a memory device is provided, which comprises: a first electrically conductive line 12, a memory pillar structure (13, 14, 15, 158) comprising a lower electrode plate 132, a selector material plate 134, an upper electrode plate 136, a refractory metal-containing etch stop plate 142, a ruthenium etch stop plate 144, a conductive pillar 146, and a memory element 15 overlying the first electrically conductive line 12, and a second electrically conductive line 22 overlying the memory pillar structure (13, 14, 15, 158).

In one embodiment, the refractory metal-containing etch stop plate 142 consists essentially of tantalum, tungsten, rhenium, niobium, molybdenum, intermetallic alloy thereof, or conductive metallic nitride thereof. In one embodiment, the conductive pillar 146 comprises, and/or consists essentially of, a material selected from an elemental metal, an intermetallic alloy, a conductive metallic nitride material, a conductive metallic carbide material, and a conductive carbon-based material. In one embodiment, the conductive pillar 146 consists essentially of tantalum nitride, undoped carbon or carbon doped with boron or nitrogen; the ruthenium etch stop plate 144 consists essentially of ruthenium; the refractory metal-containing etch stop plate 142 consists essentially of tantalum nitride, and the upper electrode plate 136 comprises undoped amorphous carbon or amorphous carbon doped with boron or nitrogen. In one embodiment, the conductive pillar has a thickness in a range from 20 nm to 50 nm, the ruthenium etch stop plate has a thickness in a range from 2 nm to 5 nm, the refractory metal-containing etch stop plate has a thickness in a range from 2 nm to 5 nm, and the upper electrode plate thickness ranges from 1 nm to 10 nm.

In one embodiment, the memory element 15 comprises a vertical magnetic tunnel junction 150 of a spin transfer torque (STT) magnetoresistive random access memory (MRAM) cell. The vertical magnetic tunnel junction 150 has a taper angle in a range from 1 degrees to 30 degrees with respective to a vertical direction.

In one embodiment, the selector material plate 133 comprises an ovonic threshold switch selector element. In one embodiment, the vertical magnetic tunnel junction 150 is narrower than the ovonic threshold switch selector element 134.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:
    forming a layer stack including a lower electrode layer, a selector material layer, an upper electrode layer, a refractory metal-containing etch stop layer, a ruthenium etch stop layer, a conductive material layer, and at least one memory material layer over a substrate;
    patterning the at least one memory material layer into a memory element;
    patterning the conductive material layer into a conductive pillar using the ruthenium etch stop layer as an etch stop by performing a first anisotropic etch process having a first etch chemistry that etches the conductive material layer selective to ruthenium;
    patterning the ruthenium etch stop layer into an ruthenium plate using the refractory metal-containing etch stop layer as an etch stop by performing a second anisotropic etch process having a second etch chemistry that etches ruthenium selective to a material of the refractory metal-containing etch stop layer;
    patterning the refractory metal-containing etch stop layer into refractory metal-containing etch stop plate by performing a third anisotropic etch process having a third etch chemistry that etches a material of the refractory metal-containing etch stop layer selective to a material of the upper electrode layer without etching through the upper electrode layer; and
    anisotropically etching the upper electrode layer, the selector material layer, and the lower electrode layer by performing additional anisotropic etch processes.

2. The method of claim 1, wherein an ovonic threshold switch selector element is formed by anisotropically etching the selector material layer.

3. The method of claim 2, wherein the refractory metal-containing etch stop layer consists essentially of tantalum, tungsten, rhenium, niobium, molybdenum, intermetallic alloy thereof, or a conductive metallic nitride thereof.

4. The method of claim 3, wherein the third anisotropic etch process is a timed based etch process which employs a fluorine-based plasma which is timed to etch through the refractory metal-containing etch stop layer without etching all the way through the upper electrode layer, such that the ovonic threshold switch material is not exposed to the fluorine-based plasma.

5. The method of claim 4, wherein the first anisotropic etch process employs another fluorine-based or an oxygen-based plasma, and the second anisotropic etch process employs a chlorine-based plasma.

6. The method of claim 5, wherein the conductive material layer comprises a material selected from an elemental metal, an intermetallic alloy, a conductive metallic nitride material, a conductive metallic carbide material, or a conductive carbon-based material.

7. The method of claim 6, wherein:
the conductive material layer consists essentially of tantalum nitride, undoped carbon or doped carbon;
the ruthenium etch stop layer consists essentially of ruthenium;
the refractory metal-containing etch stop layer consists essentially of tantalum nitride; and
the upper electrode layer comprises undoped amorphous carbon or amorphous carbon doped with boron or nitrogen.

8. The method of claim 7, wherein:
the conductive material layer thickness ranges from 20 nm to 50 nm;
the ruthenium etch stop layer thickness ranges from 2 nm to 5 nm;
the refractory metal-containing etch stop layer thickness ranges from 2 nm to 5 nm; and
the upper electrode layer thickness ranges from 1 nm to 10 nm.

9. The method of claim 2, wherein the at least one memory material layer comprises a vertical magnetic tunnel junction of a spin transfer torque (STT) magnetoresistive random access memory (MRAM) cell.

10. The method of claim 9, further comprising:
forming an ion milling mask over the at least one memory material layer; and
patterning the at least one memory material layer into an array of memory elements by ion milling using the ion milling mask.

11. The method of claim 1, wherein the vertical magnetic tunnel junction is narrower than the ovonic threshold switch selector element.

12. A memory device, comprising:
a first electrically conductive line;
a memory pillar structure comprising a lower electrode plate, a selector material plate, an upper electrode plate, a refractory metal-containing etch stop plate, a ruthenium etch stop plate, a conductive pillar, and a memory element and overlying the first electrically conductive line; and
a second electrically conductive line overlying the memory pillar structure.

13. The memory device of claim 12, wherein the refractory metal-containing etch stop layer consists essentially of tantalum, tungsten, rhenium, niobium, molybdenum, intermetallic alloy thereof, or a conductive metallic nitride thereof.

14. The memory device of claim 12, wherein the conductive pillar comprises a material selected from an elemental metal, an intermetallic alloy, a conductive metallic nitride material, a conductive metallic carbide material, or a conductive carbon-based material.

15. The memory device of claim 14, wherein:
the conductive pillar consists essentially of tantalum nitride, undoped carbon or doped carbon;
the ruthenium etch stop plate consists essentially of ruthenium;
the refractory metal-containing etch stop plate consists essentially of tantalum nitride; and
the upper electrode plate comprises undoped amorphous carbon or amorphous carbon doped with boron or nitrogen.

16. The memory device of claim 12, wherein:
the conductive pillar has a thickness in a range from 20 nm to 50 nm;
the ruthenium etch stop plate has a thickness in a range from 2 nm to 5 nm;
the refractory metal-containing etch stop plate has a thickness in a range from 2 nm to 5 nm; and
the upper electrode plate thickness ranges from 1 nm to 10 nm.

17. The memory device of claim 12, wherein the memory element comprises a vertical magnetic tunnel junction of a spin transfer torque (STT) magnetoresistive random access memory (MRAM) cell.

18. The memory device of claim 17, wherein:
the vertical magnetic tunnel junction has a taper angle with respective to a vertical direction; and
the taper angle is in a range from 1 degrees to 30 degrees.

19. The memory device of claim 17, wherein the selector material plate comprises an ovonic threshold switch selector element, and wherein the vertical magnetic tunnel junction is narrower than the ovonic threshold switch selector element.

20. An electrical system, comprising: a storage device comprising at least memory device of claim 12.

* * * * *